(12) United States Patent
Tiffin et al.

(10) Patent No.: US 6,191,032 B1
(45) Date of Patent: *Feb. 20, 2001

(54) THIN TITANIUM FILM AS SELF-REGULATING FILTER FOR SILICON MIGRATION INTO ALUMINUM METAL LINES

(75) Inventors: Don A. Tiffin; William S. Brennan, both of Austin; David Soza, Smithville; Patrick L. Smith, Austin; Allen White, Austin; Tim Z. Hossain, Austin, all of TX (US)

(73) Assignee: Advanced Micro Devices, Inc., Sunnyvale, CA (US)

( * ) Notice: Under 35 U.S.C. 154(b), the term of this patent shall be extended for 0 days.

This patent is subject to a terminal disclaimer.

(21) Appl. No.: 08/795,959

(22) Filed: Feb. 4, 1997

(51) Int. Cl.[7] .................................................. H01L 21/44
(52) U.S. Cl. ...................... 438/653; 438/655; 438/656; 438/682; 438/685; 438/688
(58) Field of Search ..................... 438/653, 688, 438/656, 685, 655, 682; 428/620, 641, 650, 651, 660; 427/96; 148/518, DIG. 34, DIG. 35

(56) References Cited

U.S. PATENT DOCUMENTS

| 4,998,157 |   | 3/1991  | Yokoyama et al. ............ 23/48 |
| 5,180,688 | * | 1/1993  | Bryant et al. ............. 437/195 |
| 5,266,521 | * | 11/1993 | Lee et al. ................ 437/188 |
| 5,397,744 | * | 3/1995  | Sumi et al. ............... 437/200 |
| 5,521,120 | * | 5/1996  | Nulman et al. ............ 437/190 |
| 5,604,155 | * | 2/1997  | Wang .................... 437/190 |

FOREIGN PATENT DOCUMENTS

| 0 307 272 | 3/1989 | (EP) . |
| 8-153791  | 6/1996 | (JP) . |

OTHER PUBLICATIONS

Lee, et al., "Roles of TI–Intermetallic Compound Layers on the Electromigration Resistance of AL–CU Interconnecting Stripes", Journal of Applied Physics, vol. 71, No. 12, Jun. 15, 1992, pp. 5877–5887.

Besser, P.R., Sanchez, J.E. Jr., and Alvis, R., The Effect of Si on $TiAl_3$ Formation in Ti/Al Alloy Bilayers, Proceedings of the 1994 MRS Fall Meeting, vol. 355, pp. 631–636, Materials Research Society, Pittsburgh, PA (1995).

Wolf, Stanley, *Silicon Processing for the VLSI Era: vol. 2–Process Integration*, 1990, Lattice Press, pp. 116–117, 121–131, and 189–199.

* cited by examiner

*Primary Examiner*—Paul Thibodeau
*Assistant Examiner*—Holly C Rickman
(74) *Attorney, Agent, or Firm*—Skjerven Morrill MacPherson LLP

(57) ABSTRACT

It has been observed that Si introduced into an Al metal line of an Al, Ti, and Si-containing layer stack of an integrated circuit, at concentrations uniformly less than the solid solubility of Si in Al, results in a reduction in Al metal line voiding. Such voiding is a stress induced phenomenon and the introduction of Si appears to reduce stresses in the Al metal lines. By controlling Ti deposition conditions to achieve desired thickness and grain-size characteristics of the Ti underlayer, a self-regulating filter for introduction of Si into the Al metal layer is provided. Si is introduced into the Al metal layer by migration through a suitably deposited Ti layer, rather than during Al layer deposition. In this way Si is introduced into the Al and Al metal line voiding is reduced, while avoiding excess concentration of Si which can result in formation of Si precipitates in the Al metal lines, thereby avoiding related reductions metal line cross-sections and reducing electromigration-induced open circuit failures.

24 Claims, 4 Drawing Sheets

THIN TITANIUM FILM AS SELF-REGULATING FILTER FOR SILICON MIGRATION INTO ALUMINUM METAL LINES

BACKGROUND OF THE INVENTION

1. Field of the Invention

The present invention relates to integrated circuit fabrication, and more particularly to the reduction of voiding in Al metal lines.

2. Description of the Related Art

Metallization lines in advanced integrated circuits are often fabricated from sputter-deposited Al/Ti bilayers. In particular, sputtered Ti is widely used in integrated circuits as an underlayer film for Al-based multilayer metallizations. The Al/Ti bilayer has improved electromigration resistance as compared to a single layer Al metallization. However, Ti and Al react at temperatures above 350° C. to form $TiAl_3$, producing a 5.9% volumetric contraction. In a typical interconnect processing sequence, the Al/Ti alloy metallization stack is deposited at temperatures <300° C. followed by lithographic patterning and etching. Dielectric passivation deposition occurs at elevated temperatures >350° C. Upon cooling, the metal line cross-section, which is rigidly attached to the encapsulating material, is subject to a large tensile hydrostatic stress state since the Al has a larger coefficient of thermal expansion than the passivation. Subsequent thermal cycles often reach temperatures greater than 400° C., leading to further $TiAl_3$ formation and volume contraction. Strain induced by the volumetric contraction of $TiAl_3$ leads to increases in void formation in the Al metal line because voiding is a tensile hydrostatic stress relaxation mechanism. See Besser, P. R., Sanchez, J. e. Jr., and Alvis, R., ., *The Effect of Si on TiAl3 Formation in Ti/Al Alloy Bilayers*, Proceedings of the 1994 MRS Fall Meeting, Vol. 355, p. 631, Materials Research Society, Pittsburg, Pa. (1995).

The reaction rate for the $Ti+3Al=>TiAl_3$ reaction has been shown to be a function of the concentration of alloying elements such as Cu and Si in the Al. As a result, Al:Si alloys have been used to reduce $TiAl_3$ formation. See Besser et al. Si has also been used in NMOS integrated circuits as an alloying element in Al for reduction of junction spiking in simple Al-to-Si ohmic contact structures. However, in both cases deposited films containing both Al and Si (typically, ~1% wt Si), exhibit Si precipitation problems. During the cooling cycle of a thermal anneal, the solid solubility of Si in Al decreases with decreasing temperature. The Al thus becomes supersaturated with Si, which causes nucleation and growth of Si precipitates out of the Al:Si solution. Si precipitates formed within the Al interconnect lines can increase the susceptibility of the lines to electromigration failure. In narrow Al lines, the precipitates can be large enough to obstruct a large fraction of the cross-sectional area of the metal line. In particular, the size of the Si precipitates in Al: 1% Si alloys can range from about 0.4–1.5 µm, depending on how slowly the films are cooled. At locations where such precipitates are formed, a large flux-divergence in the current is produced. This flux divergence, in turn, can lead to early failure of the conductor by an electromigration-induced open circuit. See generally, Wolf, *Silicon Processing for the VLSI Era: Volume 2*-Process Integration, § 3.4.4, Lattice Press, 1990.

SUMMARY OF THE INVENTION

It has been observed that Si introduced into an Al metal line of an Al, Ti, and Si-containing layer stack of an integrated circuit, at concentrations uniformly less than the solid solubility of Si in Al, results in a reduction in Al metal line voiding. Some voiding is a stress induced phenomenon and the introduction of Si appears to reduce stresses in the Al metal lines. By controlling Ti deposition conditions to achieve a desired thickness and grain-size characteristics of the Ti underlayer, a self-regulating filter for introduction of Si into the Al metal layer is provided. Si is introduced into the Al metal layer by migration through a suitably deposited Ti layer. In this way Si is introduced into the Al and Al metal line voiding is reduced, while avoiding excess concentration of Si which can result in formation of Si precipitates in the Al metal lines, thereby avoiding related reductions in metal line cross-sections and reducing electromigration-induced open circuit failures.

In an embodiment in accordance with the present invention, a method for reducing voiding of Al metal lines in a Ti/Al metal stack includes depositing a Ti-comprising layer on a Si-comprising dielectric layer, depositing, essentially Si free, the Al-comprising overlayer on the Ti-comprising layer, and migrating an amount of Si from the Si-comprising dielectric layer through the Ti-comprising layer and into the Al-comprising overlayer. The amount of Si so migrated is greater than a trace amount but no greater than that soluble in the Al-comprising overlayer. Depositing of the Ti-comprising layer on the Si-comprising dielectric layer is under conditions to provide a filter for Si migration into the Al-comprising overlayer.

In a further embodiment, the Ti-comprising layer depositing step includes depositing the Ti-comprising layer to a predetermined thickness and with predetermined Ti grain sizes. The predetermined thickness and Ti grain sizes are selected to provide the filter for Si migration from the Si-comprising dielectric layer into the Al-comprising overlayer. In yet a further embodiment, the migrating step includes introducing a diffusion profile of Si into the Al-comprising overlayer. The diffusion profile exhibits a generally decreasing concentration of Si in the Al-comprising overlayer at increasing distances from an interface between the Al-comprising overlayer and the Ti-comprising layer. In still yet a further embodiment, the migrating step further includes introducing Si into the Al-comprising overlayer by channelling. The channelling of Si into the Al-comprising overlayer generally obscuring the diffusion profile of Si introduced into the Al-comprising overlayer by diffusion.

In another embodiment in accordance with the present invention, a method for introducing Si into an Al-comprising metal layer includes forming an only partially effective Si migration barrier layer between an essentially Si-free Al-comprising metal layer and a Si-comprising dielectric layer and migrating through the only partially effective Si migration barrier layer an amount of Si from the Si-comprising dielectric layer into the Al-comprising metal layer. The amount of Si so migrated is greater than a trace amount but no greater than that soluble in the Al-comprising metal layer.

In yet another embodiment in accordance with the present invention, a method for introducing a concentration of Si into Al metal lines of an $Al/Ti/SiO_2$ metal stack, wherein the concentration of Si so introduced being uniformly less than the solid solubility of Si in Al, includes depositing a Ti layer on $SiO_2$, depositing an essentially Si-free Al layer on the Ti layer, and migrating an amount of Si from the $SiO_2$ through the Ti layer and into the Al layer. The amount of Si so migrated is greater than a trace amount but no greater than that soluble in the Al layer. In a further embodiment, the Al layer remains essentially free from localized Si precipitates after completion of subsequent steps to fabricate an integrated circuit. In various further embodiments, migrating Si into the Al layer begins during Al layer deposition, begins after Al layer deposition, occurs primarily during Al layer deposition, or occurs primarily after Al layer deposition.

In still yet another embodiment in accordance with the present invention, a metal stack includes Si-comprising dielectric, a Si-comprising Al metal line, and Ti-comprising material disposed between the Si-comprising dielectric and the Si-comprising Al metal line. Concentrations of Si in the Si-comprising Al metal line are greater than trace concentrations but uniformly less than the solid solubility of Si in Al and essentially all of the Si in the Al- and Si-comprising layer is introduced through the Ti-comprising material.

BRIEF DESCRIPTION OF THE DRAWINGS

The present invention may be better understood, and its numerous objects, features, and advantages made apparent to those skilled in the art by referencing the accompanying drawings.

FIG. 2A illustrates a metal stack including an Al metal line exhibiting voiding. FIG. 2B illustrates a contrasting metal stack including an Al metal line without voiding and incorporating Si introduced by migration through a Ti/TiAl$_3$ layer in accordance with an embodiment of the present invention.

FIG. 3A depicts a representative Si concentration profile indicative of Si migration into an Al metal layer through a suitably deposited Ti layer in accordance with an embodiment of the present invention. In contrast, FIG. 3B depicts a representative Si concentration profile indicative of negligible Si migration into an Al metal layer through a Ti layer of substantially identical thickness to that associated with FIG. 3A, but deposited under different conditions.

Features depicted in the drawings are not necessarily to scale and like or similar features may be designated by the same reference numeral(s) throughout the drawings.

DESCRIPTION OF THE PREFERRED EMBODIMENT(S)

Figure 1:
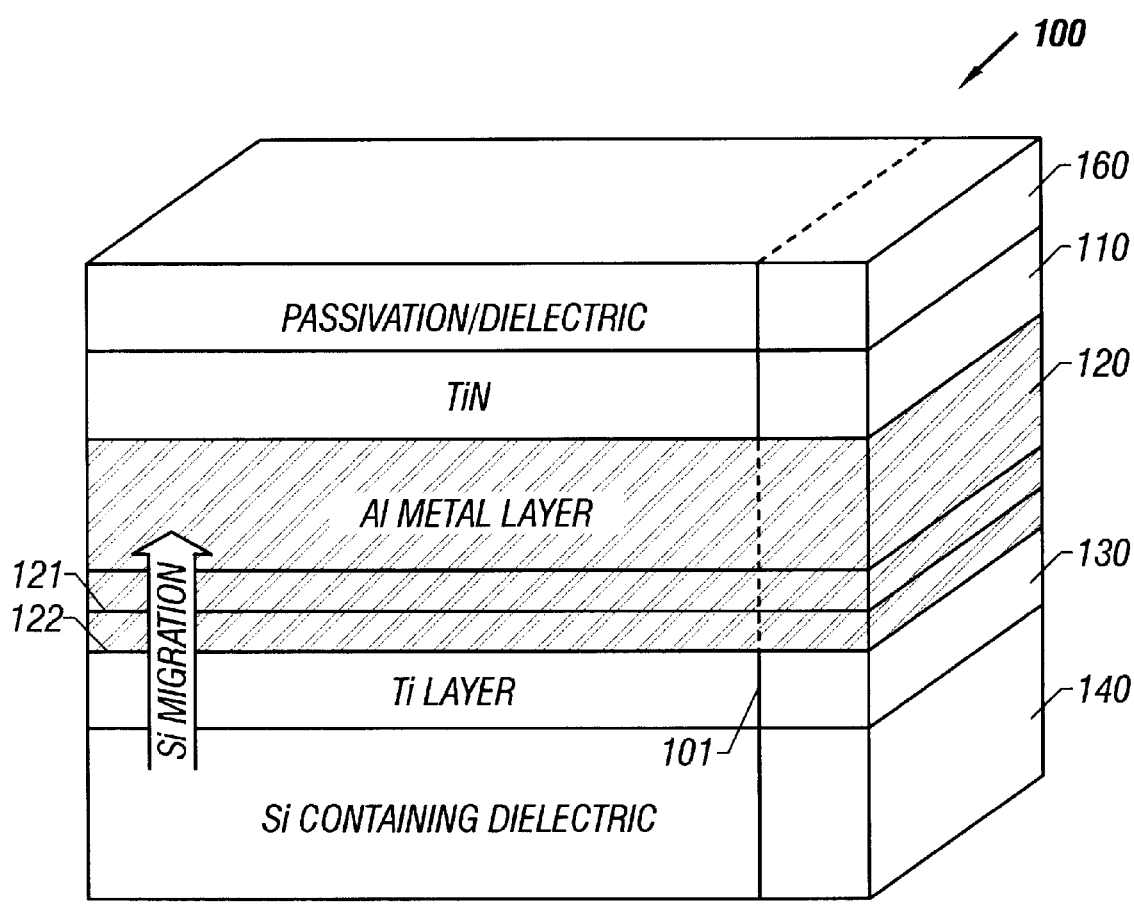
FIG. 1 is a pictorial illustration of a metal stack fabricated in accordance with an embodiment of the present invention including a Ti underlayer for Si migration into a Al metal layer.

FIG. 1 depicts a metal stack structure 100 illustrative of the vertical stacking of layers associated with a metal interconnect in an integrated circuit. Metal stack structure 100 includes an Al metal layer 120 and a Ti underlayer 130 deposited on a Si-containing dielectric layer 140. Ti underlayer 130, when suitably fabricated, acts as a self-regulating filter for Si migration from Si-containing dielectric layer 140 to Al metal layer 120. A TiN diffusion barrier 110 and a passivation layer 160 are also shown layered above Al metal layer 120. In an uppermost metal layer embodiment in accordance with FIG. 1 (e.g., in an M3 metal layer embodiment for a 3-level multi-level interconnect structure), passivation layer 160 typically includes a Spin On Glass (SOG) encapsulating passivation layer or other suitable passivation. FIG. 1 is also representative of embodiments for intermediate metal layers in a multi-level interconnect structure (e.g., an M2 metal layer embodiment). In such intermediate metal layer embodiments, passivation layer 160 includes TEOS, SiO$_2$, or any other suitable passivation or dielectric upon which subsequent metal layers may be deposited. In general, a wide variety of Si-containing passivations and dielectrics, including silane oxide, TEOS, HDP oxide, Spin On Dielectric (SOD/SOG), SiO$_2$ etc. are suitable.

A first-level metal interconnect layer (i.e., an M1 metal layer) typically presents device contact challenges and diffusion barrier requirements incompatible with the characteristics of Ti underlayer 130 which are described below. In particular, Al metal lines are commonly deposited over Si diffusion barriers or are presaturated with Si to prevent junction spiking. However, in an integrated circuit having device contact structures for which junction spiking vulnerability is otherwise addressed or in which spatial variations in the composition of an underlayer are possible, the metal stack structure 100 of FIG. 1, is also representative of MI embodiments.

Ti underlayer 130 is a thin layer of Ti deposited over Si-containing dielectric layer 140 under conditions providing relatively small Ti grain sizes such that Ti underlayer 130 performs as a filter for Si migration from Si-containing dielectric layer 140 into Al metal layer 120. Si migration through Ti underlayer 130 is enhanced during processing steps which heat Al metal layer 120 (and Ti underlayer 130) such as during deposition of the Al layer itself, dielectric passivation, anneal, subsequent metal layer processing, encapsulation, SOG cure, etc. By providing a filter for a Si migration, Ti underlayer 130 allows a quantity of Si to be introduced into Al metal layer 120 which corresponds to a Si concentration less than the solubility of Si in Al. Silicon migration into Al metal layer 120 is regulated by the thickness and grain size characteristics of Ti underlayer 130 and by the chemical potential thereacross. As a result, Ti underlayer 130 functions as a self-regulating filter. In contrast with conventional methods for introducing Si into an Al metal layer or line (e.g., sputter depositing from a single target containing both Al and Si or coevaporation of Si and Al), migration through the self-regulating filter formed by Ti underlayer 130 avoids oversaturation of Al metal layer 120 with Si. The self-regulating filter formed by Ti underlayer 130 limits Si migration into Al metal layer 120 so as to prevent oversaturation with Si. As a result, Ti underlayer 130 also limits the formation of Si precipitates, flux divergences in operating currents, and electromigration-induced open circuit defects.

In general, the mechanism for migration of Si through Ti underlayer 130 appears to be diffusion regulated by the thickness and grain structure characteristics of Ti underlayer 130. However, there is also evidence to suggest channelling as an additional contributing mechanism for migration of Si through Ti underlayer 130 and into Al metal layer 120. Migration therefore encompasses the transport of Si whether by diffusion or by diffusion augmented by channelling or any other similar transport mechanism.

In addition to limiting the rate of Si introduction into Al metal layer 120 and thereby preventing oversaturation on a macroscopic scale, the migration method of introducing Si into Al metal layer 120 (as limited by Ti underlayer 130) provides concentrations of Si in Al uniformly less than the solubility limit of Si in Al. In contrast, conventional methods for introducing Si into an Al metal layer (e.g., sputter depositing or coevaporation of Si and Al) result in local non-uniformities in Si concentration. As a result, localized oversaturation of Si in Al can occur even if the macroscopic ratio of Si and Al deposition constituents is in accordance with a concentration of Si below the solubility limit of Si in Al. Referring to FIG. 1, migration of Si through Ti underlayer 130 results in substantially uniform concentrations of Si in planes parallel to the Al/Ti interface (e.g., a first substantially uniform concentration in plane 121 and a second substantially uniform concentration in plane 122). Si is introduced into Al metal layer 120 by migration through Ti underlayer 130.

Figure 2A:
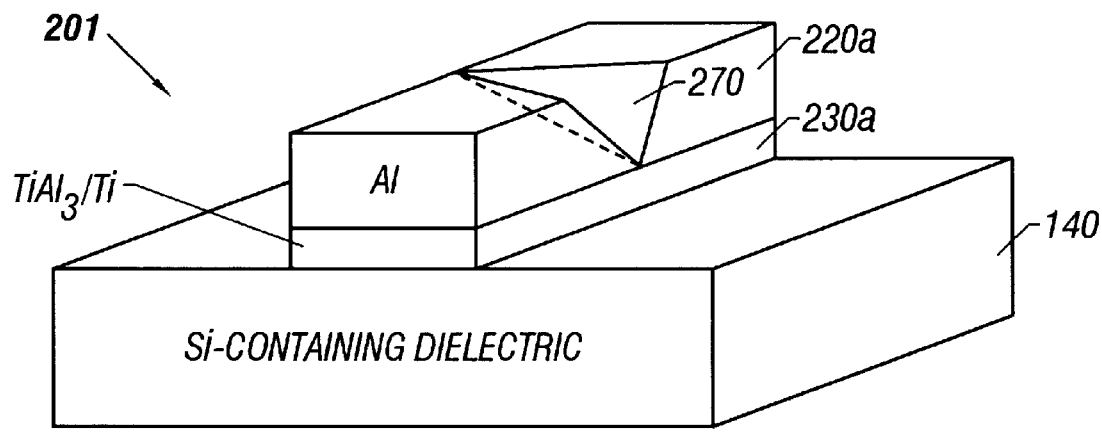
FIGS. 2A and 2B are pictorial illustrations of metal stack structures.
Figure 2B:
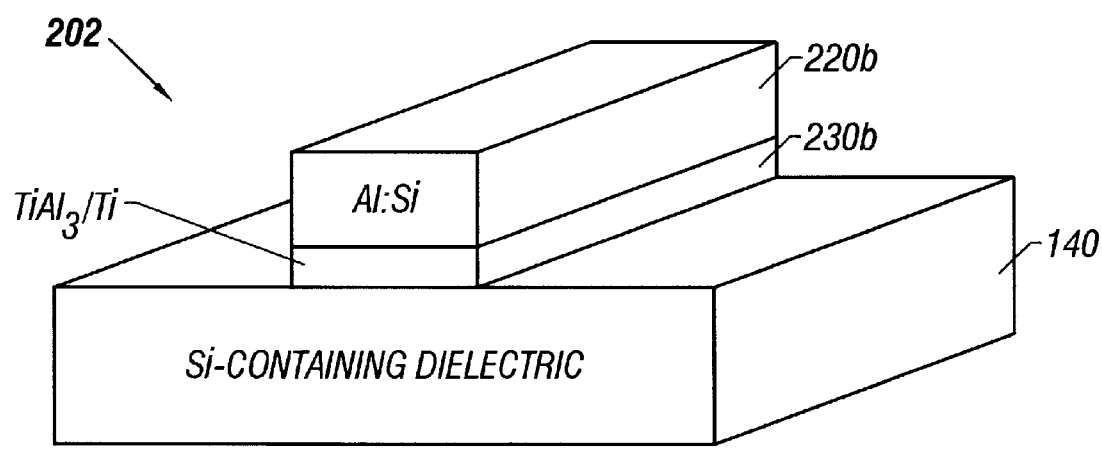

FIGS. 2A and 2B are illustrative of the structure of Al/Ti bilayer metal lines after lithographic patterning and etching. In the first case, FIG. 2A, the thickness and grain size characteristics of the Ti underlayer are such that Si migration from Si-containing dielectric layer 140 is insignificant and Al metal line 220a is substantially free from Si migrated thereinto through Ti-containing underlayer 230a. However, in the second case, FIG. 2B, the thickness and grain size characteristics of the Ti underlayer are such that Si migration from Si-containing dielectric layer 140 is self-regulating as described above. In the embodiment of FIG. 2B, Al metal line 220b includes Si migrated thereinto through Ti-containing underlayer 230b. In the first case, FIG. 2A, Al metal line 220a exhibits voiding 270, whereas in the second case, FIG. 2B, Al metal line 220b, which includes Si concentrations uniformly less than the solubility of Si in Al, is substantially free from voiding.

Figure 3A:
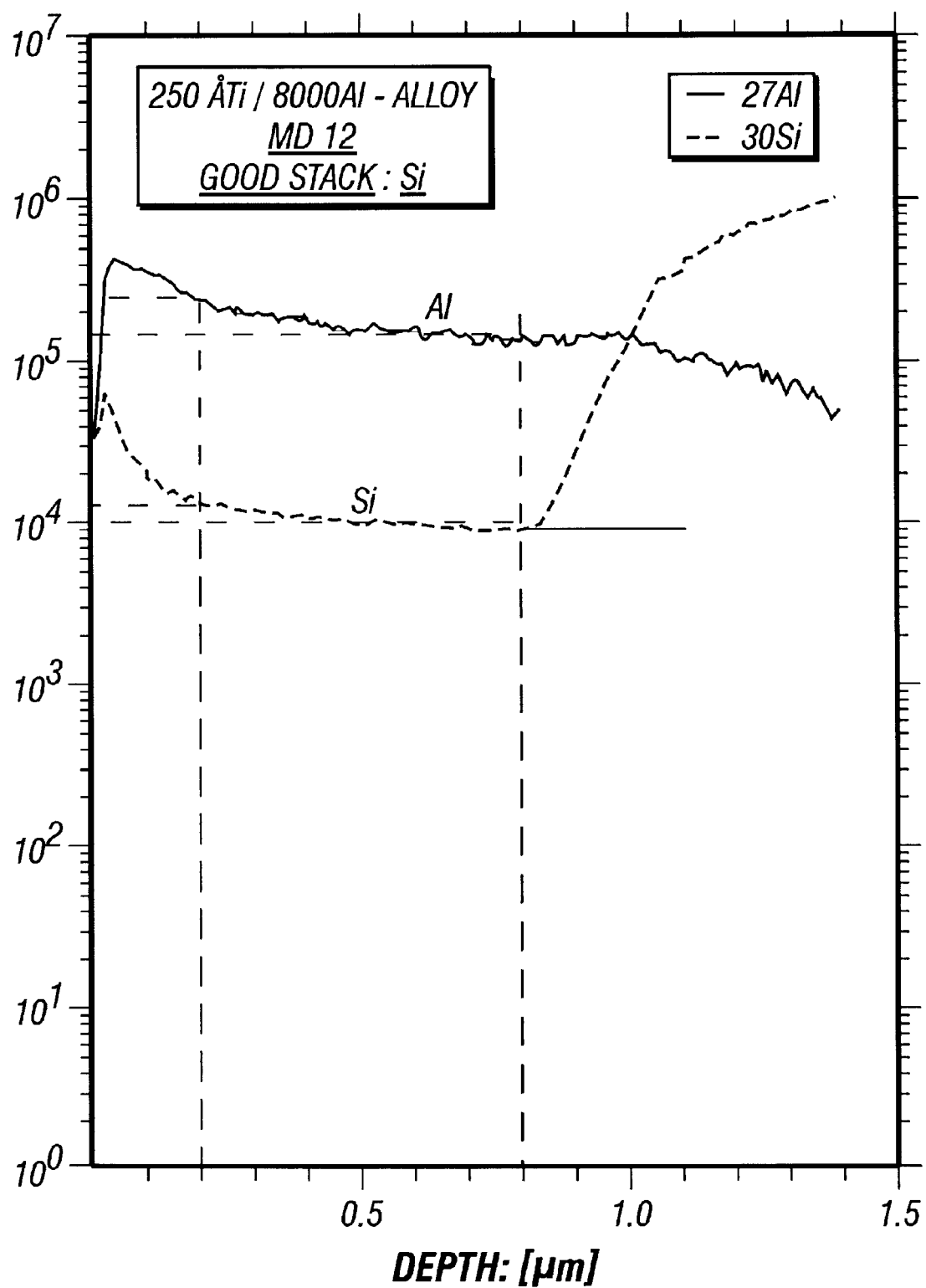
FIGS. 3A and 3B include Si concentration profiles.

FIG. 3A depicts measurements indicative of Si concentration measured in a metal stack structure such as metal stack structure 100 structured and formed in accordance with the present invention. Illustratively, in the context of FIG. 1, the Si concentration profile of FIG. 3A corresponds to that in a vertical plane 101 defined through Al metal layer 120. In an illustrative metal stack corresponding to FIG. 3A, the Al metal layer and Ti-containing underlayer (as deposited) are approximately 8000 Å and 250 Å in respective thicknesses. The measurements of FIG. 3A (and of FIG. 3B) are counts per second of atomic constituents sputtered off the metal stack structure at increasing depths. As a result, these measurements are affected by sputtering yield as material composition changes through metal stack depth. Nonetheless, FIG. 3A demonstrates Si concentrations greater than a trace amount migrated into Al metal layer 120 (or Al metal line 220b) through a suitably formed Ti-containing underlayer.

Figure 3B:
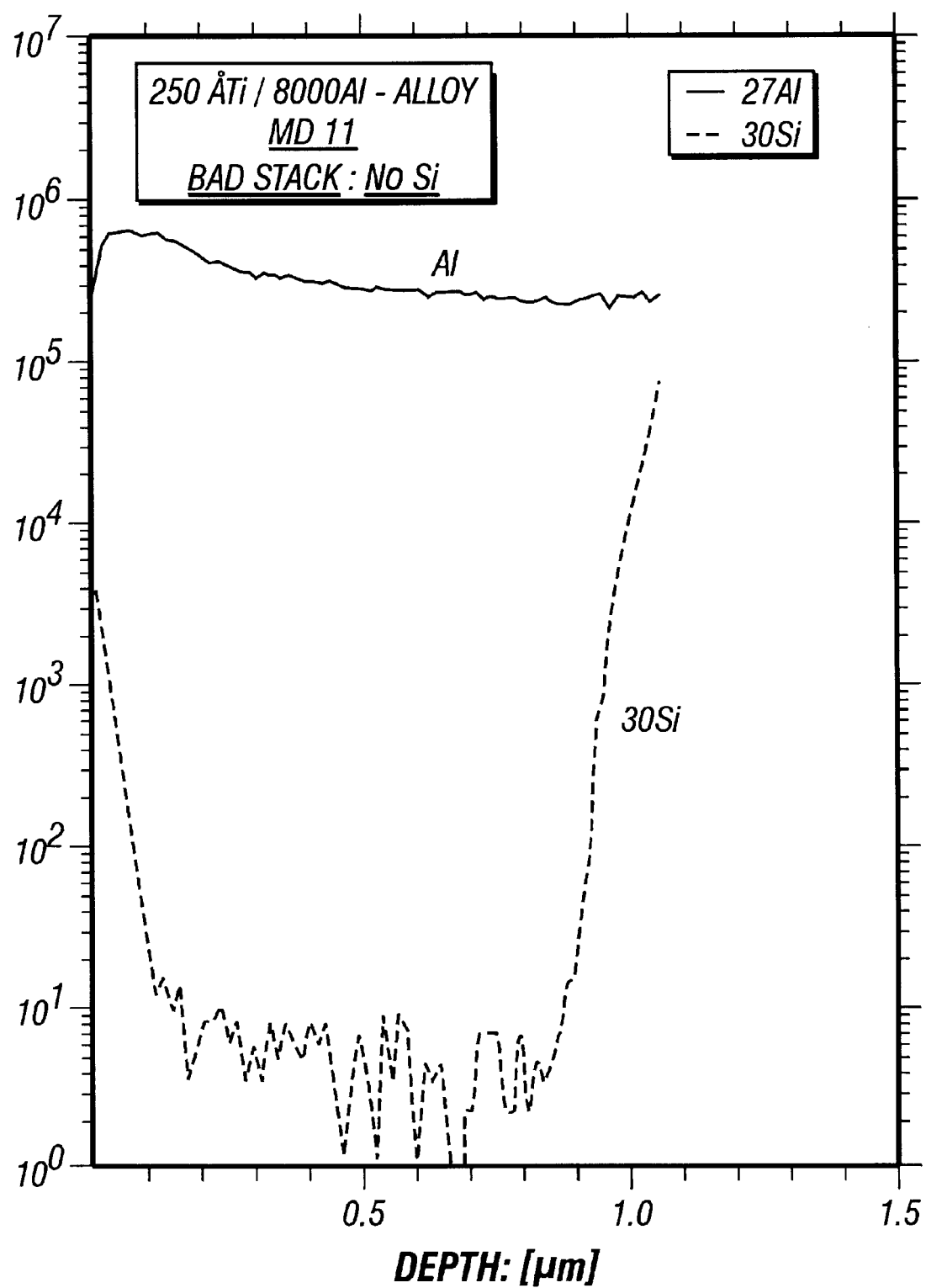

In contrast, FIG. 3B depicts similar measurements for a metal stack structure such as that shown in FIG. 2A, i.e., in which the thickness and grain size characteristics of the Ti underlayer are such that Si migration from Si-containing dielectric layer 140 is insignificant and Al metal line 220a is substantially free from Si migrated thereinto through Ti-containing underlayer 230a. As shown in FIG. 3B, concentrations of Si in the Al metal line are no more than trace concentrations as indicated by counts per second approximately three orders of magnitude less than those shown in FIG. 3A.

Referring back to FIG. 3A, the plots of Si- and Al-corresponding counts per second on $\log_{10}$ vertical scale indicate a decreasing ratio of Si to Al at increasing distance from the nominal Ti/Al interface (0.8 μm). Illustratively, a Si-corresponding count of ~$10^4$ counts/sec and an Al-corresponding count of ~$1.5 \times 10^5$ counts/sec were measured at 8000 Å (i.e., at the nominal pre-reaction Al/Ti interface). Similarly, a Si-corresponding count of ~$1.3 \times 10^4$ counts/sec and an Al-corresponding count of ~$2.5 \times 10^5$ counts/sec were measured at 2000 Å (i.e., 6000 Å from the nominal pre-reaction reaction Al/Ti interface). Based on these measurements, the Si-to-Al count ratio of 0.0667 at the nominal pre-reaction Al/Ti interface decreases to 0.052 at a distance of ~6000 Å from the nominal pre-reaction Al/Ti interface. Although, a decreasing absolute Si-corresponding count at increasing distances from the nominal Ti/Al interface would be expected for a purely diffusional migration of Si into Al metal layer 120, two factors are thought to account for the slightly increasing absolute Si-corresponding count. First, the measurements are affected by a changing (possibly decreasing) sputtering yield as material composition changes through metal stack depth. Second, other mass transport mechanisms (e.g., channelling) may contribute to the total migration of Si into Al metal layer 120.

Al deposition, dielectric passivation, anneal, subsequent metal layer processing, encapsulation, SOG cure, etc., typically occur at temperatures >350° C. and at which the Al reacts with Ti form $TiAl_3$. As a result, a deposited Ti underlayer at least partially reacts with Al from the Al metal layer to form $TiAl_3$ in respective Ti-containing underlayers 230a and 230b. Depending on total thermal exposure of the metal stack structure of a fabricated integrated circuit, some or all of the Ti from a Ti layer such as Ti underlayer 130 is consumed by the reaction to form $TiAl_3$, producing the 5.9% volumetric contraction previously described. Upon cooling, the metal line cross-section, e.g., that of Al metal line 220a, which is rigidly attached to encapsulating material or passivation (not shown), is subject to a large tensile hydrostatic stress state since the Al has a larger coefficient of thermal expansion than the encapsulating material or passivation. Subsequent thermal cycles often reach temperatures greater than 400° C., leading to further $TiAl_3$ formation and volume contraction. Strain induced by the volumetric contraction of $TiAl_3$ leads to the formation of voids, e.g., void 270.

However, it has been observed that a Ti underlayer (e.g., the unreacted Ti underlayer 130 precursor to Ti-containing underlayer 230b) having suitable thickness and grain size characteristics allows Si from Si-containing dielectric layer 140 to diffuse into the Al metal line 220b and reduces the formation of voids. Preferably, Ti underlayer 130 has an average Ti grain size ranging from approximately 0.09 μm to approximately 0.3 μm, although Ti underlayers having average Ti grain sizes ranging from approximately 0.05 μm to approximately 0.7 μm are also suitable. Preferably, Ti underlayer 130 has a thickness ranging from approximately 150 Å to approximately 350 Å, although Ti underlayers ranging from approximately 50 Å to approximately 1200 Å are also suitable. In general, smaller average Ti grain sizes allow Ti layers of greater thickness while maintaining adequate permeability to Si migration.

Given a Ti underlayer 130 of suitable thickness and grain size characteristics, Si migrates therethrough into Al deposited thereon beginning during the Al deposition step. Although Si migration through Ti underlayer 130 (or through the reacted resultant Ti-containing underlayer 230b) can continue throughout subsequent processing steps to the extent chemical potential exists across the underlayer, it has been observed that early migration of Si into the Al (i.e., into Al metal layer 120 or Al metal line 220b during Al deposition) is important for reducing Al metal line voiding. Later Si migration into Al metal layer 120, e.g., after Ti underlayer 130 has been consumed by reaction to form $TiAl_3$ during subsequent thermal cycles associated with later process steps, can be too late if the tensile stress states thought to be responsible for voiding have already developed. For this reason, introduction of Si into Al metal layer 120 through Ti underlayer 130, rather than through an overlayer of similar composition and characteristics, is preferred. Ti underlayer 130 advantageously has thickness and grain size characteristics as described above and provides for introduction of Si into the Al metal layer or line during Al metal layer deposition. However, suitable metal stack structures can include both early and later migrated Si, e.g., through both Ti underlayer 130 and an analogous Ti overlayer.

Process parameters for sputter deposition of Ti underlayer 130 to achieve suitable thickness and grain size characteristics are now summarized. Deposition is performed at temperatures preferably ranging from approximately 200° C. to approximately 300° C., although temperatures ranging from approximately 60° C. to approximately 300° C. are also suitable. Preferred power levels range from approximately 2500 W to approximately 3500 W (with a power ramp rate of approximately 3000 W/sec), although power levels ranging from approximately 1000 W to approximately 4000 W are also suitable. Preferred deposition pressures range from approximately 2.5 mTorr to approximately 4.5 mTorr, although deposition pressures ranging from approximately 2 mTorr to approximately 8 mTorr are also suitable. Preferred deposition rate ranges from approximately 1750 Å/min to approximately 2250 Å/min, although deposition rates ranging from approximately 1000 Å/min to approximately 3000 Å/min are also suitable. Resulting Ti underlayer 130 thin films exhibit bulk resistivity in the range from approximately 50 $\mu$ohms/cm to 60 $\mu$ohms/cm. Vacuum chamber base pressures less than $3 \times 10^{-8}$ Torr are suitable, while base pressures less than $9 \times 10^{-9}$ Torr are preferred for reduction of contaminants in Ti underlayer 130.

Persons of ordinary skill in the art will appreciate suitable tradeoffs between various of the sputter process parameters to achieve the desired Ti grain size and thickness characteristics. Methods in accordance with the present invention include any such suitable variations. In addition, alternative deposition processes, e.g., Chemical Vapor Deposition (CVD), spin coating or electroplating are also suitable with process parameters tailored to achieve the above-described thickness and Ti grain size characteristics. Deposition of Ti underlayer 130 (and Ti-containing underlayer 230b ) is by any such suitably parameterized deposition process.

Process parameters for sputter deposition of Al metal layer 120 are now summarized. Deposition is performed at temperatures preferably ranging from approximately 300° C. to approximately 400° C. for Al: 1% Cu alloy, based on the phase diagram for theta phase precipitates, although temperatures ranging from approximately 250° C. to approximately 400° C. are also suitable. Preferred power levels range from approximately 12000 W to approximately 14000 W (with a power ramp rate of approximately 12000 W/sec), although power levels ranging from approximately 9000 W to approximately 15000 W are also suitable. Preferred deposition pressures range from approximately 1.5 mTorr to approximately 2.5 mTorr, although deposition pressures ranging from approximately 1.5 mTorr to approximately 5 mTorr are also suitable. Preferred thicknesses of the deposited Al metal layer 120 range from approximately 4000 Å to approximately 6000 Å (for an M1 layer) and range from approximately 8000 Å to approximately 10000 Å (for an M2 layer). Suitable Al metal layer 120 thicknesses for additional metal layers will be appreciated by persons of ordinary skill in the art. Resulting Al metal layers, e.g., Al metal layer 120, exhibit bulk resistivity in the range from approximately 2.82 $\mu$ohms/cm to 3.02 $\mu$ohms/cm. Vacuum chamber base pressures less than $5 \times 10^{-8}$ Torr are suitable, while base pressures less than $1 \times 10^{-8}$ Torr are preferred for reduction of contaminants in Al metal layer 120. Persons of ordinary skill in the art will appreciate suitable variations in the various sputter process parameters as well as alternative Al deposition processes. Methods in accordance with the present invention include any such suitable variations and alternatives.

While the invention has been described with reference to various embodiments, it will be understood that these embodiments are illustrative and that the scope of the invention is not limited to them. Many variations, modifications, additions, and improvements of the embodiments described are possible. For example, alternative deposition processes and process parameters consistent with the Ti thickness and grain size objectives for Ti underlayer 130 are also possible. Silicon migration may be by diffusion, channelling, or other suitable mass transport mechanism. In addition, the composition of the various metal stack layers described herein, including for example, Al metal layer 120, Ti underlayer 130, and Si-containing dielectric layer 140, is not limited to single element compositions. Each metal stack layer may include additional elements, and process steps for the fabrication thereof may include deposition of, doping with, or incorporation of such additional elements, without departing from the spirit and scope of the present invention. Although forming of suitable Al-containing, Ti-containing and Si-containing layers has been described herein in a frame of reference typical of traditional semiconductor fabrication technologies, i.e., as a sequence of layers deposited in a vertical dimension, terms such as underlayer and overlayer, etc. merely indicate a relationship between pairs of layers, not a spatial orientation requirement during fabrication or of the structures in a completed integrated circuit. These and other variations, modifications, additions, and improvements may fall within the scope of the invention as defined in the claims which follow.

What is claimed is:

1. A method for reducing voiding of Al metal lines in a Ti/Al metal stack, the method comprising the steps of:
    depositing a Ti-comprising layer on a Si-comprising dielectric layer, the depositing being under conditions to provide a filter for Si migration into an Al-comprising overlayer;
    depositing, Si-free, the Al-comprising overlayer on the Ti-comprising layer; and
    migrating an amount of Si from the Si-comprising dielectric layer through the Ti-comprising layer and into the Al-comprising overlayer, the amount of Si so migrated being no greater than that soluble in the Al-comprising overlayer such that the Al-comprising overlayer is substantially free from Si precipitates after the migrating, the migrating forming at least one substantially uniform concentration Si plane in the Al-comprising overlayer.

2. The method of claim 1, wherein the Ti-comprising layer depositing step includes depositing the Ti-comprising layer to a predetermined thickness and with predetermined Ti grain sizes, the predetermined thickness and Ti grain sizes being selected to provide the filter for Si migration from the Si-comprising dielectric layer into the Al-comprising overlayer.

3. The method of claim 1, wherein the Ti-comprising layer depositing step includes depositing the Ti-comprising layer to a thickness of approximately 150 Å to approximately 350 Å and with Ti grain sizes of approximately 0.09 $\mu$m to approximately 0.3 $\mu$m.

4. The method of claim 1, wherein the Ti-comprising layer depositing step includes sputter depositing the Ti-comprising layer to a thickness of approximately 50 Å to approximately 1200 Å and with Ti grain sizes of approximately 0.05 $\mu$m to approximately 0.7 $\mu$m.

5. The method of claim 1, wherein the Ti-comprising layer depositing step includes sputter depositing the Ti-comprising layer to a thickness of approximately 150 Å to approximately 350 Å.

6. The method of claim 1, wherein the Ti-comprising layer depositing step includes sputter depositing the Ti-comprising layer with Ti grain sizes of approximately 0.09 μm to approximately 0.3 μm.

7. The method of claim 1, wherein the Ti-comprising layer depositing step includes sputter depositing the Ti-comprising layer at a temperature of approximately 200° C. to approximately 300° C. at a deposition rate of approximately 1750 Å/min to approximately 2250 Å/min to provide the self-regulating filter having a thickness of approximately 150 Å to approximately 350 Å and Ti grain sizes of approximately 0.09 μm to approximately 0.3 μm.

8. A method, as recited in claim 1,
wherein the migrating step includes introducing a diffusion profile of Si into the Al-comprising overlayer, the diffusion profile exhibiting a decreasing concentration of Si in the Al-comprising overlayer at increasing distances from an interface between the Al-comprising overlayer and the Ti-comprising layer; and
wherein the method further includes the step of reacting at least a portion of the Ti from the Ti-comprising layer with Al from the Al-comprising overlayer to form a $TiAl_3$/Ti layer between the Al-comprising overlayer and the Si-comprising comprising dielectric layer.

9. A method, as recited in claim 8, wherein the migrating step further includes introducing Si into the Al-comprising overlayer by channelling, the channelling of Si into the Al-comprising overlayer obscuring the diffusion profile of Si introduced into the Al-comprising overlayer by diffusion.

10. A method, as recited in claim 1,
wherein the Ti-comprising layer deposited during the Ti-comprising layer depositing step consists essentially of Ti; and
wherein the Al-comprising overlayer deposited during the Al-comprising overlayer depositing step includes approximately 1%, by weight, Cu.

11. A method for introducing Si into an Al-comprising metal layer comprising:
forming an only partially effective Si migration barrier layer between an Si-free Al-comprising metal layer and a Si-comprising dielectric layer; and
migrating through the only partially effective Si migration barrier layer an amount of Si from the Si-comprising dielectric layer into the Al-comprising metal layer, the amount of Si so migrated being no greater than that soluble in the Al-comprising metal layer such that the Al-comprising metal layer is substantially free from Si precipitates after the migrating, the migrating forming at least one substantially uniform concentration Si plane in the Al-comprising metal layer.

12. The method of claim 11 wherein forming the only partially-effective Si migration barrier includes:
depositing the only partially-effective Si migration barrier on the Si-comprising dielectric layer; and
depositing the Si-free Al metal layer on the only partially-effective Si migration barrier.

13. The method of claim 11 wherein forming the only partially-effective Si migration barrier includes:
depositing the only partially-effective Si migration barrier on the Si-free Al metal layer; and
depositing the Si-comprising dielectric layer on the only partially-effective Si migration barrier.

14. The method of claim 11 wherein forming the only partially-effective Si migration barrier includes:
forming a Ti-comprising layer having a thickness of approximately 150 Å to approximately 350 Å and Ti grain sizes of approximately 0.09 μm to approximately 0.3 μm between the Si-free Al metal layer and the Si-comprising dielectric layer.

15. A method for introducing a concentration of Si into Al metal lines of an $Al/Ti/SiO_2$ metal stack, the concentration of Si so introduced being uniformly less than the solid solubility of Si in Al, the method comprising:
depositing a Ti layer on $SiO_2$;
depositing a Si-free Al layer on the Ti layer;
migrating an amount of Si from the $SiO_2$ through the Ti layer and into the Al layer, the amount of Si so migrated being no greater than that soluble in the Al layer such that the Al layer is substantially free from Si precipitates after the migrating, the migrating forming at least one substantially uniform concentration Si plane in the Al layer.

16. The method of claim 15, wherein the Ti layer depositing includes depositing the Ti layer to a predetermined thickness and with predetermined Ti grain size characteristics, the predetermined thickness and Ti grain size characteristics being selected to provide, in conjunction with a chemical potential thereacross, a self-regulating filter for limiting Si migration from the $SiO_2$ into the Al layer.

17. The method of claim 15, wherein migrating Si into the Al layer includes diffusion through the Ti layer.

18. The method of claim 15, wherein migrating Si into the Al layer includes channeling through the Ti layer.

19. The method of claim 15, wherein migrating Si into the Al layer begins during Al layer deposition.

20. The method of claim 15, wherein migrating Si into the Al layer continues after Al layer deposition.

21. The method of claim 15, wherein migrating Si into the Al layer occurs primarily during Al layer deposition.

22. The method of claim 15, wherein migrating Si into the Al layer occurs primarily after Al layer deposition.

23. A method, as recited in claim 15, wherein the migrating step includes introducing a diffusion profile of Si in the Al layer, the diffusion profile exhibiting a decreasing concentration of Si in the Al layer at increasing distances from an interface between the Al layer and the Ti layer.

24. A method, as recited in claim 23, wherein the migrating step further includes introducing Si into the Al-comprising overlayer by channelling, the channelling of Si into the Al-comprising overlayer obscuring the diffusion profile of Si introduced into the Al-comprising overlayer by diffusion.

* * * * *